(12) United States Patent
Yamauchi et al.

(10) Patent No.: US 10,225,930 B2
(45) Date of Patent: Mar. 5, 2019

(54) METHOD OF PRODUCING SUSPENSION BOARD WITH CIRCUIT

(71) Applicant: NITTO DENKO CORPORATION, Osaka (JP)

(72) Inventors: Daisuke Yamauchi, Osaka (JP); Takatoshi Sakakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 154 days.

(21) Appl. No.: 14/753,433

(22) Filed: Jun. 29, 2015

(65) Prior Publication Data

US 2016/0057867 A1 Feb. 25, 2016

(30) Foreign Application Priority Data

Aug. 21, 2014 (JP) ................................. 2014-168395

(51) Int. Cl.
*G11B 5/127* (2006.01)
*H04R 31/00* (2006.01)
(Continued)

(52) U.S. Cl.
CPC ........... *H05K 1/056* (2013.01); *H05K 3/0082* (2013.01); *H05K 3/027* (2013.01); *H05K 3/44* (2013.01); *G11B 5/484* (2013.01); *H05K 3/064* (2013.01); *H05K 2201/0969* (2013.01); *H05K 2203/0323* (2013.01)

(58) Field of Classification Search
CPC ..... G11B 5/486; G11B 5/4853; G11B 5/4826; G11B 5/4833; G11B 5/484; H05K 1/056; H05K 1/028; H05K 1/118
See application file for complete search history.

(56) References Cited

U.S. PATENT DOCUMENTS 5,865,365 A * 2/1999 Nishikawa ........... B23K 1/0016
228/180.22
6,084,747 A 7/2000 Takahashi
(Continued)

FOREIGN PATENT DOCUMENTS

JP 03-191074 A 8/1991
JP 03191073 A * 8/1991
(Continued)

OTHER PUBLICATIONS

Notification of Reasons for Refusal issued by the Japanese Patent Office dated Mar. 13, 2018, in connection with Japanese Patent Application No. 2014-168395.
(Continued)

*Primary Examiner* — Paul D Kim
(74) *Attorney, Agent, or Firm* — Edwards Neils LLC; Jean C. Edwards, Esq.

(57) ABSTRACT

A method of producing a suspension board with circuit includes the steps of preparing a metal supporting layer, forming a curable insulating layer on the metal supporting layer using a photosensitive curable insulating composition such that an opening is formed in the curable insulating layer, curing the curable insulating layer to form an insulating layer, subjecting the metal supporting layer exposed from the opening to microwave plasma treatment, and forming a metal conducting portion on the metal supporting layer exposed from the opening.

5 Claims, 5 Drawing Sheets

(51) Int. Cl.
*H05K 1/05* (2006.01)
*H05K 3/00* (2006.01)
*H05K 3/02* (2006.01)
*H05K 3/44* (2006.01)
*G11B 5/48* (2006.01)
*H05K 3/06* (2006.01)

(56) References Cited

U.S. PATENT DOCUMENTS

| | | | |
|---|---|---|---|
| 6,582,778 B2 * | 6/2003 | Namiki | C23C 16/045 427/237 |
| 7,142,395 B2 * | 11/2006 | Swanson | G11B 5/484 360/244.3 |
| 8,082,656 B1 * | 12/2011 | Pokornowski | G11B 5/4833 205/119 |
| 2005/0000939 A1 | 1/2005 | Hagihara et al. | |
| 2009/0183901 A1 * | 7/2009 | Kataoka | H01L 21/4846 174/257 |
| 2012/0124829 A1 | 5/2012 | Kamei et al. | |
| 2014/0287155 A1 * | 9/2014 | Matsumoto | B01J 23/75 427/535 |
| 2015/0228461 A1 * | 8/2015 | Fukazawa | H01J 37/32091 216/71 |

FOREIGN PATENT DOCUMENTS

| | | |
|---|---|---|
| JP | H10269721 A | 10/1998 |
| JP | 2000090420 A | 3/2000 |
| JP | 2001068454 A | 3/2001 |
| JP | 2012-114217 | 6/2012 |
| JP | 2013084320 A | 5/2013 |

OTHER PUBLICATIONS

Decision to Grant a Patent issued by the Japanese Patent Office dated Jul. 13, 2018, in connection with corresponding Japanese Patent Application No. 2014-168395.

Office Action, issued by the State Intellectual Property Office of China dated Sep. 5, 2018, in connection with corresponding Chinese Patent Application No. 201510450294.2.

* cited by examiner

METHOD OF PRODUCING SUSPENSION BOARD WITH CIRCUIT

CROSS-REFERENCE TO RELATED APPLICATION

The present application claims priority from Japanese Patent Application No. 2014-168395 filed on Aug. 21, 2014, the content of which is herein incorporated by reference into this application.

BACKGROUND OF THE INVENTION

Field of the Invention

The present invention relates to a method of producing a suspension board with circuit, and particularly to a method of producing a suspension board with circuit used in a hard disk drive.

Description of the Related Art

A suspension board with circuit including a metal supporting board, an insulating base layer formed thereon, and a conductive pattern such as wires formed thereon has been known. The suspension board with circuit on which a magnetic head is mounted is used in a hard disk drive or the like.

The conductive pattern includes write wires and read wires. Each of the wires has a front end portion connected to the magnetic head and a rear end portion connected to an external board. To reduce noise in signal transmission, the conductive pattern includes the pair of write wires and the pair of read wires. As each of the write wires and the read wires, differential signal wires including a first wire which transmits a first electric signal, and a second wire which transmits a second electric signal in antiphase to the first electric signal are typically used.

In such differential signal wires, a differential impedance is generated so that differential impedance needs to be reduced.

As a countermeasure against the differential impedance, a configuration (interleaved wiring) in which the first and second wires in each of the pair of write wires and the pair of read wires are alternately arranged has been known. In this configuration, it is necessary to allow the first wires to cross the second wires without causing contact therebetween. That is, it is necessary to electrically connect one (first wire) of the wires in one pair to one (first wire) of the wires in the other pair over the other wire (second wire) in each of the pairs.

As an implementation of such a method, Japanese Unexamined Patent No. 2012-114217 discloses a suspension board with circuit in which, on one side and the other side of second wires, respective metal conducting portions are formed to extend through an insulating base layer and connect first wires and a metal supporting board. In the suspension board with circuit, the first wire located on one side is electrically connected to the first wire located on the other side via the metal conducting portion located on one side, the metal supporting board, and the metal conducting portion located on the other side. This allows the first wires to cross the second wires without causing contact therebetween.

SUMMARY OF THE INVENTION

In a suspension board with circuit, a larger number of terminal portions to be connected to the outside have been required, and consequently a larger number of wires have been required. Accordingly, a conductive pattern formed on the suspension board with circuit is required to be further reduced in size, and metal conducting portions are also required to be reduced in size.

In the suspension board with circuit disclosed in Japanese Unexamined Patent No. 2012-114217, the insulating base layer is formed on the metal supporting board to be patterned such that openings each having a circular shape in plan view are formed in the insulating base layer to expose the metal supporting board. Then, in the openings, the metal conducting portions are formed.

However, when exposed metal surfaces are further reduced in size, a problem arises in that the rate at which an electric resistance value at each of the interfaces between the metal conducting portions and the exposed metal surfaces increases.

It is therefore an object of the present invention to provide a method of producing suspension board with circuit which can reduce an electric resistance value at the interface between a metal conducting portion and a metal supporting layer.

A method of producing a suspension board with circuit of the present invention includes the steps of preparing a metal supporting layer, forming a curable insulating layer on the metal supporting layer using a photosensitive curable insulating composition such that an opening is formed in the curable insulating layer, curing the curable insulating layer to form an insulating layer, subjecting the metal supporting layer exposed from the opening to microwave plasma treatment, and forming a metal conducting portion on the metal supporting layer exposed from the opening.

In accordance with the method of producing such a suspension board with circuit, after the curable insulating layer is cured, the metal supporting layer exposed from the opening is subjected to the microwave plasma treatment. This allows a foreign material (component derived from the curable insulating layer) deposited on the exposed surface of the metal supporting layer to be effectively removed. As a result, it is possible to reduce an electric resistance value at the interface between the metal conducting portion and the metal supporting layer.

In the method of producing a suspension board with circuit of the present invention, preferable that the step of forming the curable insulating layer is performed by applying a solution containing the photosensitive curable insulating composition onto the meal supporting layer and developing the applied solution.

The method of producing such a suspension board with circuit allows a smaller opening to be accurately formed.

In the method of producing a suspension board with circuit of the present invention, it is preferable that a gas used for the microwave plasma treatment contains an inert gas.

The method of producing such a suspension board with circuit allows the foreign material deposited on the exposed surface of the metal supporting layer to be more effectively removed. As a result, it is possible to more reliably reduce the electric resistance value at the interface between the metal conducting portion and the metal supporting layer.

In the method of producing a suspension board with circuit of the present invention, it is preferable that the metal conducting portion is electrically connected to differential signal wires.

The method of producing such a suspension board with circuit can reduce noise in electric signals.

In the method of producing a suspension board with circuit of the present invention, it is preferable that a plurality of the openings and a plurality of the metal conducting portions are formed, and the plurality of metal conducting portions are electrically connected to each other via the metal supporting layer.

The method of producing such a suspension board with circuit allows the individual wires to cross each other without causing contact therebetween and thus allows an improvement in the degree of freedom of the placement of the wires. In addition, since the number of insulating layers need not be increased, the suspension board with circuit can be reduced in film thickness and cost.

The method of producing a suspension board with circuit of the present invention can reduce an electric resistance value at the interface between the metal conducting portion and the metal supporting layer.

DETAILED DESCRIPTION OF THE INVENTION

Figure 1:
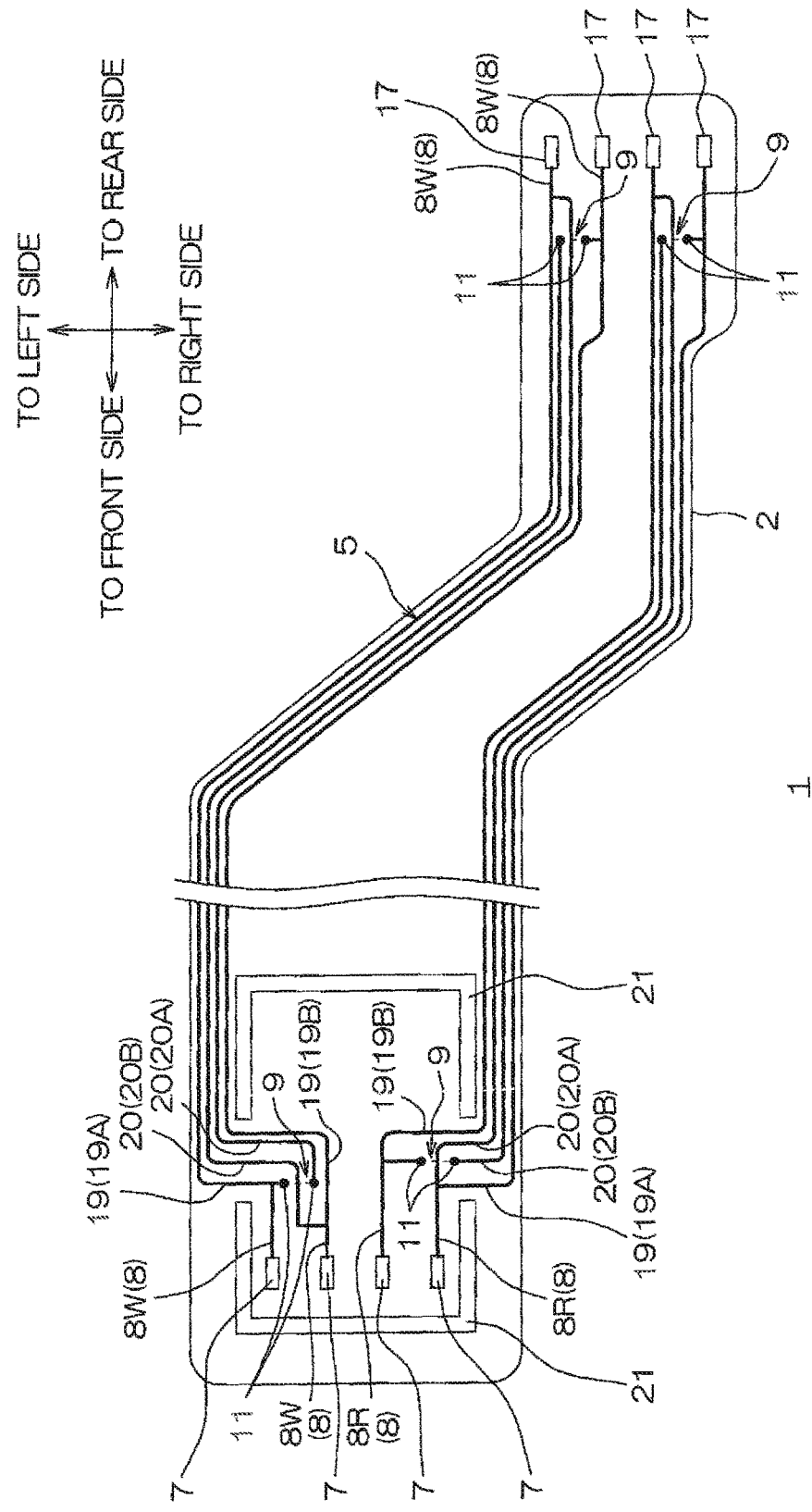
FIG. 1 shows a plan view of a suspension board with circuit obtained in accordance with an embodiment of a method of producing a suspension board with circuit of the present invention.

In FIG. 1, the left and right sides of the surface of the paper sheet with FIG. 1 are assumed to be a front side (one side in a first direction) and a rear side (the other side in the first direction). The upper and lower sides of the surface of the paper sheet with FIG. 1 are assumed to be a left side (one side in a second direction) and a right side (the other side in the second direction). The front and back sides in a depth direction perpendicular to the surface of the paper sheet with FIG. 1 are assumed to be an upper side (one side in a third direction or thickness direction) and a lower side (the other side in the third direction or thickness direction). In the drawings other than FIG. 1 also, directions are based on those in FIG. 1. Note that, in FIGS. 1 to 3, an insulating cover layer 6 is omitted for clear illustration of positioning of a conductive pattern 5 and signal wire connection portions 11.

Figure 5F:
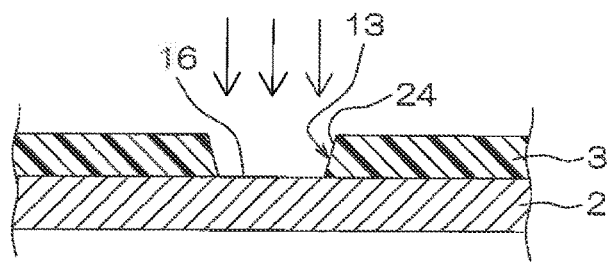
FIGS. 5F to 5I are process views illustrating the method of producing the suspension board with circuit shown in FIG. 1 subsequently to FIGS. 4A to 4E, which show cross-sectional views along the line B-B in FIG. 2A, FIG. 5F showing the step of preforming microwave plasma treatment, FIG. 5G showing the step of forming metal conducting portions, FIG. 5H showing the step of forming an insulating cover layer, and FIG. 5I showing the step of forming support openings
Figure 5G:
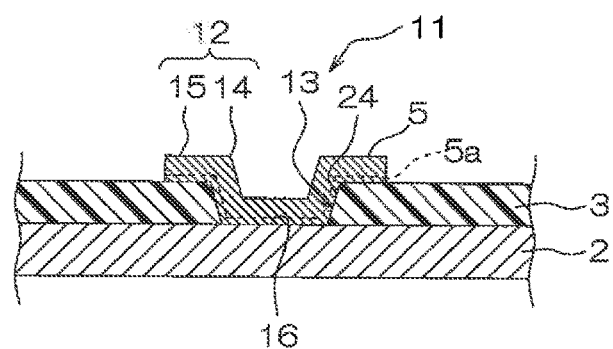

As shown in FIG. 1, a suspension board with circuit 1 is formed in a flat belt shape extending in a longitudinal direction. As shown in FIG. 5I, the suspension board with circuit 1 includes a metal supporting layer 2, an insulating base layer 3 as an insulating layer formed on the metal supporting layer 2, the conductive pattern 5 formed on the insulating base layer 3, and the insulating cover layer 6 formed on the insulating base layer 3 so as to cover the conductive pattern 5.

The metal supporting layer 2 is formed in a shape corresponding to the two-dimensional shape of the suspension board with circuit 1. In the metal supporting layer 2, slits 21 and support openings 23 described later are formed so as to extend through the metal supporting layer 2 in the thickness direction. Between the slits 21, head-side terminals 7 described later are interposed in a left-right direction.

Examples of a metal material for forming the metal supporting layer 2 include stainless steel, a 42-alloy; aluminum, a copper-beryllium alloy, or phosphor bronze. Preferably, stainless steel is used.

The thickness of the metal supporting layer 2 is in a range of, e.g., not less than 8 μm, or preferably not less than 10 μm and, e.g., not more than 50 μm, or preferably not more than 30 μm.

The insulating base layer 3 is formed on the upper surface of the metal supporting layer 2 into a pattern corresponding to the conductive pattern 5 and the signal wire connection portions 11 (described layer). Note that, in the insulating base layer 3 located in the signal wire connection portions 11, openings 13 described later are formed.

Examples of an insulating material for forming the insulating base layer 3 include a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin.

Preferably, e.g., a polyimide resin, a polyamide imide resin, an acrylic resin (such as polymethyl methacrylate (PMMA)), or the like is used. More preferably, a polyimide resin is used.

The thickness of the insulating base layer 3 is in a range of, e.g., not less than 1 μm, or preferably not less than 3 μm and, e.g., not more than 35 μm, or preferably not more than 33 μm.

The conductive pattern 5 includes head-side terminals 7 connected to the front end portion of the suspension board with circuit 1, external-side terminals 17 connected to the rear end portion of the suspension board with circuit 1, and signal wires 8 connected to the head-side terminals 7 and to the external-side terminals 17.

The plurality of (four) head-side terminals 7 are arranged in the front end portion of the suspension board with circuit 1 to be spaced apart from each other in the left-right direction. Each of the head-side terminals 7 is formed in a generally rectangular shape in plan view which is long in a front-rear direction.

The plurality of (four) external-side terminals 17 are arranged in the rear end portion of the suspension board with circuit 1 to be spaced apart from each other in the left-right direction. Each of the external-side terminals 17 is formed in a generally rectangular shape in plan view which is long in the front-rear direction.

The signal wires 8 include a pair of write wires 8W and a pair of read wires 8R.

The pair of write wires 8 are disposed between the head-side terminals 8 and the external-side terminals 17 to extend in parallel with each other along the left end portion of the suspension board with circuit 1.

Each of the write wires 8W includes a first wire 19, and a second wire 20. That is, the pair of write wires 8W include a pair of the first wires 19 and a pair of the second wires 20.

The pair of first wires 19 are arranged in parallel to be spaced apart from each other in the left-right direction. Each of the first wires 19 is connected to the corresponding head-side terminal 7 at the front end portion thereof and connected to the corresponding external-side terminal 17 at the rear end portion thereof.

The pair of second wires 20 are arranged in parallel inwardly of the pair of first wires 19 in the left-right direction to be spaced apart from each other in the left-right direction.

Specifically, a second wire 20A corresponding to a first wire 19A of the outer write wire 8W in the left-right direction is disposed to be adjacent to a first wire 19B of the inner write wire 8W in, the left-right direction. A second wire 20B corresponding to the first wire 19B of the inner write wire 8W in the left-right direction is disposed to be adjacent to the first wire 19A of the outer write wire 8W in the left-right direction.

Thus, in the left-right direction, the first wire 19B of the (one) inner write wire 8W in the left-right direction, the second wire 20A corresponding to the first wire 19A of the (other) outer write wire SW in the left-right direction, the second wire 20B corresponding to the first wire 19B of the (one) inner write wire 8W in the left-right direction, and the first wire 19A of the (other) outer write wire 8W in the left-right direction are arranged in parallel. That is, in the left-right direction, the one write wire 8W and the other write wire SW are alternately arranged so that the first wire 19B of the one write wire 8W, the second wire 20A of the other write wire 8W, the second wire 20B of the one write wire 8W, and the first wire 19A of the other write wire 8W are arranged in the left-right direction. In other words, the two wires of the one write wire 8W and the two wires of the other write wire 8W are alternately arranged.

Each of the second wires 20 is branched from either one of the front and rear portions of the corresponding first wire 19 and joined (converged) to the other thereof via one of cross connection, portions 9 described later.

Specifically, in the outer write wire 8W in the left-right direction, the second wire 20 is branched from the rear portion of the first wire 19 and joined to the front portion thereof via the cross connection portion 9. On the other hand, in the inner write wire 8W in the left-right direction, the second wire 20 is branched from the front portion of the first wire 19 and joined to the rear portion thereof via the cross connection portion 9.

The pair of read wires 8R are disposed between the head-side terminals 7 and the external-side terminals 17 so as to extend in parallel with each other along the right end portion of the suspension board with circuit 1. The pair of read wires 8R have generally the same (generally bilaterally symmetric) configuration as that of the pair of write wires 8W so that a description thereof is omitted.

Examples of a conductive material for forming the conductive pattern 5 (metal conducting portions 12 described later) include copper, nickel, gold, a solder, and an alloy thereof. Preferably, copper is used. The thickness of the conductive pattern 5 is in a range of e.g., not less than 3 µm, or preferably not less than 5 µm and, e.g., not more than 50 µm, or preferably not more than 10 µm.

The width of each of the head-side terminals 7 and the external-side terminals 17 is in a range of, e.g., not less than 20 µm, or preferably not less than 30 µm and, e.g., not more than 1000 µm, or preferably not more than 800 µm.

The width of each of the signal wires 8 is in a range of e.g., not less than 5 µm, or preferably not less than 8 µm and, e.g., not more than 200 µm, or preferably not more than 100 µm.

Figure 5H:
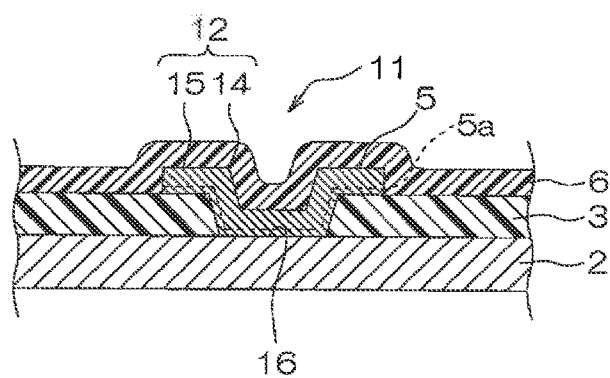
Figure 5I:
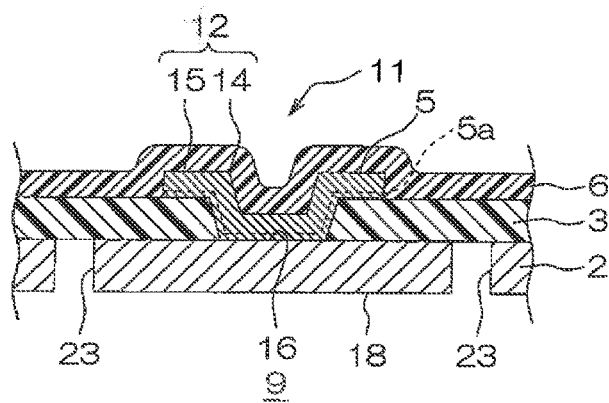

As shown in FIG. 5H, the insulating cover layer 6 is formed on the upper surface of the insulating base layer 3 exposed from the conductive pattern 5 and over the upper and side surfaces of the signal wires 8 (and the metal conducting portions 12 described later). The insulating cover layer 6 is also formed so as to expose the head-side terminals 7 and the external-side terminals 17.

As an insulating material for forming the insulating cover layer 6, the same insulating material as an insulating material for forming the insulating base layer 3 can be used. The thickness of the insulating cover layer 6 is in a range of e.g., not less than 2 µm, or preferably not less than 4 µm and, e.g., not more than 20 µm, or preferably not more than 15 µm.

Next, the cross connection portions 9 are described in detail.

As shown in FIG. 1, the cross connection portions 9 are provided so as to individually correspond to the front end portion of the second wire 20A of the write wire 8W, the rear end portion of the second wire 20B of the write wire 8W, the rear end portion of the second wire 20A of the read wire 8R, and the front end portion of the second wire 20B of the read wire 8R. Since each of the cross connection portions 9 has generally the same configuration, the cross connection portion 9 corresponding to the front end portion of the second wire 20A of the write wire 8W is described in detail.

Figure 3:
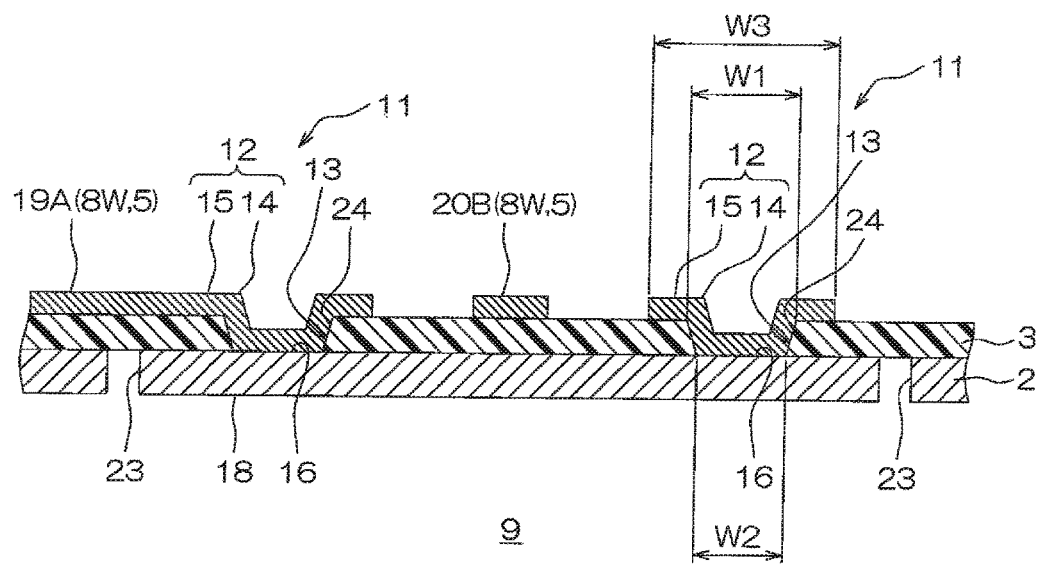
FIG. 3 is an enlarged view of each, of the signal wire connection portions of the suspension board with circuit shown in FIG. 1, which shows a cross-sectional view along the line A-A in FIG. 2A.

As shown in FIG. 3, the cross connection portion 9 includes the two signal wire connection portions 11, and a support connection portion 18 disposed between the signal wire connection, portions 11 to provide electrical connection therebetween.

Each of the signal wire connection portions 11 includes the opening 13 formed in the insulating base layer 3.

The opening 13 is formed in a tapered shape in side cross-sectional view (in a generally truncated cone shape) which has a generally circular shape in plan view and upwardly widens (i.e., having an upwardly increasing aperture cross-sectional area). The opening 13 is defined by and formed of the inclined surface (peripheral side surface) of a peripheral side portion 24 forming the peripheral side portion of the opening 13 and formed to have a surface inclined with respect to the thickness direction and the top surface (exposed metal surface 16) of the metal supporting layer 2 forming the bottom portion of the opening 13 and exposed from the insulating base layer 3. Between the upper surface of the insulating base layer 3 around the peripheral edge of the peripheral side portion 24 and the exposed metal surface 16, a stepped portion is formed. In plan view, the diameter of the outer peripheral end edge of the peripheral side portion 24 serves as the outer diameter $W_1$ of the opening 13. On the other hand, the inner peripheral end edge of the peripheral side portion 24 corresponds to the outer edge of the exposed metal surface 16. The diameter of the inner peripheral end edge of the peripheral side portion 24 serves as the inner diameter $W_2$ of the opening 13.

The signal wire connection portion 11 has the metal conducting portion 12. The metal conducting portion 12 fills the opening 13.

The metal conducting portion 12 is funned to have a generally circular shape in plan view and be concentric to the opening 13. The metal conducting portion 12 is in contact with and covers the entire exposed metal surface 16, the entire peripheral side surface (inclined surface of the peripheral side portion 24), and the upper surface of the insulating base layer 3 around the peripheral edge of the peripheral side portion 24.

The metal conducting portion 12 integrally includes an inner portion 14, and an outer portion 15 outwardly protruding from the peripheral end edge of the inner portion 14.

The inner portion 14 has a generally circular shape in plan view and is formed in a U-shaped shape having a top surface extending along the exposed metal surface 16 and the peripheral side surface in side cross-sectional view. The inner portion 14 covers the exposed metal surface 16 and the peripheral side surface. The outer peripheral edge of the inner portion 14 corresponds to the outer peripheral end edge of the peripheral side portion 24. The diameter of the outer peripheral end edge of the inner side portion 14 corresponds to the outer diameter $W_1$ of the opening 13.

The outer portion 14 is formed in a generally annular shape in plan view.

The outer diameter $W_1$ of the opening 13 (diameter of the outer peripheral end edge of the opening 13, i.e., the diameter of the inner portion 14 of the metal conducting portion 12) is in a range of, e.g., not less than 15 μm, or preferably not less than 20 μm and, e.g., not more than 110 μm, or preferably not more than 90 μm.

The inner diameter $W_2$ of the opening 13 (diameter of the inner peripheral end edge of the opening 13, i.e., the diameter of the exposed metal surface 16) is in a range of, e.g., not less than 10 μm, or preferably not less than 15 μm and, e.g., not more than 100 μm, or preferably not more than 80 μm. The ratio of the inner diameter $W_2$ of the opening 13 to the outer diameter $W_1$ of the opening 13 is in a range of, e.g., not less than 50%, or preferably not less than 65% and, e.g., not more than 95%, or preferably not more than 90%.

The diameter $W_3$ of the metal conducting portion 12 (i.e., the outer diameter of the outer portion 15) is in a range of, e.g., not less than 50 μm, or preferably not less than 70 μm and, e.g., not more than 170 μm, or preferably not more than 140 μm.

As shown in FIGS. 2A, 2B, and 3, the two signal wire connection portions 11 are disposed to be spaced apart from each other in the left-right direction with the second wire 20B being interposed therebetween. One (on the left side) of the signal wire connection portions 11 is connected to a wire branched from the front end portion of the first wire 19A, while the other (on the right side) of the signal wire connection portions 11 is connected to the front end portion of the second wire 20A. The two signal wire connection portions 11 are electrically connected by the support connection portion 18.

The support connection portion 18 is formed as a part of the metal supporting layer 2 defined by the support opening 23.

As shown in FIGS. 2B and 3, the support opening 23 is formed so as to extend through the metal supporting layer 2 in the thickness direction, have a generally rectangular frame shape in bottom view which is long in the left-right direction, and surround the two signal wire connection portions 11.

The support connection portion 18 is placed in the support opening 23 to have a generally rectangular shape in bottom view which is long in the left-right direction and traverse the second wire 20B of the one write wire 8W in the left-right direction. The support connection portion 18 is also placed inside the metal supporting layer 2 around the support opening 23 so as to be spaced apart therefrom. Consequently, the support connection portion 18 is electrically insulated from the metal supporting layer 2 around the support opening 23.

Each of the metal conducting portions 12 of the two signal wire connection portions 11 is connected to the common support connection portion 18. That is, the support connection portion 18 includes the two signal wire connection portions 11, and the second wire 20B of the write wire 8W interposed therebetween when projected in the thickness direction.

Thus, the two signal wire connection portions 11 are electrically connected via the support connection portion 18 with the second wire 20B of the write wire 8W being interposed therebetween. That is, the first wire 19A is electrically connected (conducts electricity) to the second wire 20A via the metal conducting portion 12 located on one side, the support connection portion 18, and the signal wire connection portion 11 located on the other side.

On the suspension board with circuit 1, the magnetic head (not shown) and the external board (not shown) are mounted, and then the suspension board with circuit 1 is mounted in a hard disk drive.

Next, a method of producing the suspension board with circuit 1 is described with reference to FIGS. 4A to 4E and FIGS. 5F to 5I.

Figure 4:
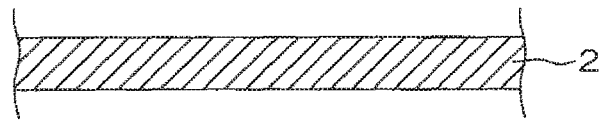
FIGS. 4A to 4E are process views illustrating a method of producing the suspension board with circuit shown in FIG. 1, which show cross-sectional views along the line B-B in FIG. 2A, FIG. 4A showing the step of preparing a metal supporting layer, FIG. 4B showing the step of forming a photosensitive curable base coating, FIG. 4C showing the step of exposing the photosensitive curable base coating, FIG. 4D showing the step of developing the photosensitive curable base coating, and FIG. 4E showing the step of curing a photo-curable insulating layer.
Figure 4:
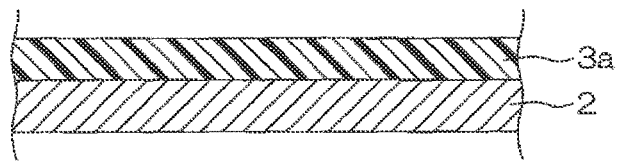
Figure 4:
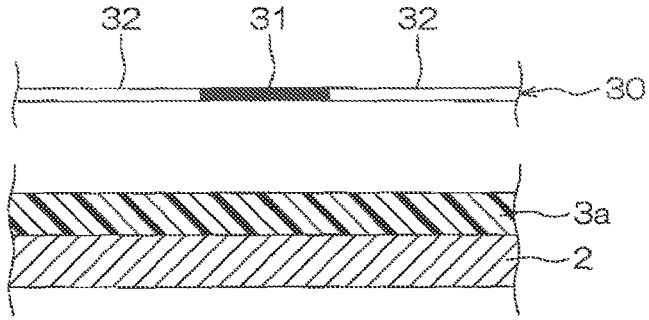
Figure 4:
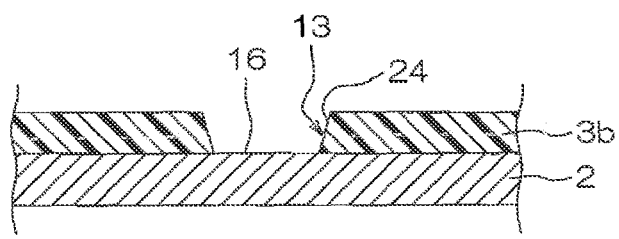
Figure 4:
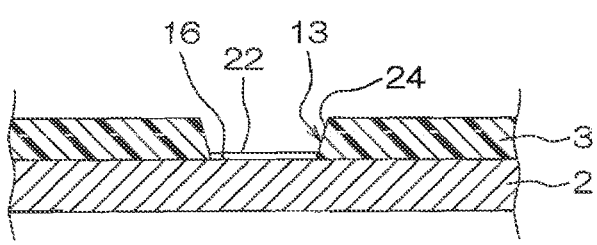

In the method, as shown in FIG. 4A, the metal supporting layer 2 having a flat plate shape extending in the longitudinal direction is prepared first.

Then, using a photosensitive curable insulating composition, a curable insulating layer 3b is formed on the metal supporting layer 2 such that the openings 13 are formed therein. Specifically, as shown in FIG. 4B, using the photosensitive curable insulating composition, a photosensitive curable base coating 3a is formed on the top surface of the metal supporting layer 2. Then, as shown in FIG. 4C, the photosensitive curable base coating 3a is exposed to light and then developed, as shown in FIG. 4D.

To form the photosensitive curable base coating 3a, e.g., onto the metal supporting layer 2, a solution (varnish) of the photosensitive curable insulating composition is applied and dried.

As the photosensitive curable insulating composition, a photosensitive thermosetting, insulating composition is preferably used. The photosensitive thermosetting insulating composition is a composition which allows a latent image to be formed using light and is cured by subsequent heating to be able to form an insulating resin.

As the photosensitive curable insulating composition, a precursor of the insulating material shown above is used.

A drying temperature is in a range of, e.g., not less than 80° C., or preferably not less than 90° C. and, e.g., not more than 200° C., or preferably not more than 180° C.

A drying time is in a range of, e.g., not less than 1 minute, or preferably not less than 3 minutes and, e.g., not more than 10 minutes, or preferably not more than 8 minutes.

The thickness of the formed photosensitive curable base coating 3a is in a range of, e.g., not less than 1 μm, or preferably not less than 3 μm and, e.g., not more than 35 μm, or preferably not more than 33 μm.

In the step shown in FIG. 4C, a photomask 30 including light shielding portions 31 and a light transmitting portion 32 is disposed over the photosensitive curable base coating 3a. Specifically, the light transmitting portion 32 is disposed to face the portion of the photosensitive curable base coating 3a where the insulating layer 3 is to be formed, and the light shielding portions 31 are disposed to face the portions of the photosensitive curable base coating 3a where the exposed metal surfaces 16 are to be formed.

Thereafter, the photosensitive curable base coating 3a is exposed to light via the photomask 30 from above. As a result, a latent image in which the portion corresponding to the light transmitting portion 32 becomes insoluble and the portions corresponding to the light shielding portions 31 are soluble is formed in the photosensitive curable base coating 3a, As a light source for the exposure, various known light sources which effectively emit ultraviolet light such as, e.g., a carbon arc lamp, a mercury-vapor arc lamp, an ultrahigh pressure mercury lamp, a high-pressure mercury lamp, an xenon lamp, and a metal hydride lamp are used. Alternatively, a light source which effectively emits visible light such as a photoflood lamp or a solar lamp is used.

An exposure dose can be set to a value in a range of, e.g., 0.05 to 10 J/cm$^2$.

Next, as shown in FIG. 4D, the photosensitive curable base coating 3a is developed to form the curable insulating layer 3b. For the development, a spray method or a dipping method using an alkaline solution as a developer is used. At this time, the portions facing the light shielding portions 31, i.e., unexposed portions of the photosensitive curable base coating 3a are dissolved to form the openings 13 exposing the top surface (exposed metal surfaces 16) of the metal supporting layer 2.

At this time, around the boundary between each of the light shielding portions 31 and the light transmitting portion 32, exposure light from the light transmitting portion 32 slightly leaks toward the light shielding portion 31. Accordingly, the boundary-side end portion of the light shielding portion 31 receives an exposure dose higher than that received by the center portion of the light shielding portion 31. As a result, at the boundary between each of the light shielding portions 31 and the light transmitting portion 32, the peripheral side portion 24 including the inclined surface (peripheral side surface) is formed.

In this manner, the curable insulating layer 3b formed with the openings 13 exposing the exposed metal surfaces 16 can be formed.

Next, as shown in FIG. 4E, the curable insulating layer 3b is cured by heating.

A heating temperature is in a range of, e.g., not less than 250° C., or preferably not less than 300° C. and, e.g., not more than 400° C., or preferably not more than 380° C.

A heating time is in a range of, e.g., not less than 45 minutes, or preferably not less than 60 minutes and, e.g., not more than 10 hours, or preferably not more than 8 house.

Thus, the insulating base layer 3 formed with the openings 13 is formed. At this time, on the exposed metal surfaces 16 of the openings 13, a foreign material 22 is deposited.

The foreign material 22 is a component derived from the insulating base layer 3. Examples of the foreign material 22 include the insulating material forming the insulating base layer 3 and a precursor thereof. The foreign material 22 is deposited on the exposed metal surfaces 16 in the steps in FIGS. 4C and 4D.

Next, as shown in FIG. 5F, microwave plasma treatment is performed.

Examples of an apparatus used for the microwave plasma treatment include a microwave plasma generator "M110-RTR" (available from Nissin Inc.).

A frequency in the microwave plasma treatment is in a range of, e.g., not less than 1.0 GHz, or preferably not less than 2.0 GHz and, e.g., not more than 10 GHz, or preferably not more than 5.0 GHz.

Examples of the gas used for the microwave plasma treatment include an oxidizing gas, an inert gas, and a reducing gas. Specific examples thereof include air, oxygen, nitrogen, argon, helium, hydrogen, and carbon dioxide.

Such an oxidizing gas, an inert gas, and a reducing gas can be used alone or in combination of two or more.

Preferably, the gas used for the microwave plasma treatment includes an inert gas.

By using such a gas, the foreign material 22 deposited on the exposed metal surfaces 16 can more reliably be removed and electric resistance values at the interfaces between the metal conducting portions 12 and the exposed metal surfaces 16 can more reliably be reduced.

A gas pressure in a chamber in which a microwave plasma is generated is in a range of, e.g., not less than 1 Pa, or preferably not less than 5 Pa and, e.g., not more than 200 Pa, preferably not more than 100 Pa, or more preferably not more than 80 Pa.

The flow rate of the gas into the chamber is in a range of, e.g., not less than 10 sccm, or preferably not less than 50 sccm and, e.g., not more than 5000 sccm, or preferably not more than 3000 sccm.

The distance from a plasma emission hole from which the microwave plasma is emitted to each of the exposed metal surfaces 16 is in a range of e.g., not less than 5 cm, or preferably not less than 10 cm and, e.g., not more than 30 cm, or more preferably not more than 25 cm.

An electric power is in a range of, not less than 0.5 kW, or preferably not less than kW and, e.g., not more than 15 kW, or preferably not more than 7 kW.

The time period of the microwave plasma treatment is in a range of, e.g., not less than 0.5 seconds, or preferably not less than 1 second and, e.g., not more than 2 minutes, or preferably not more than 1 minute.

As a result, the foreign material 22 deposited on the exposed metal surfaces 16 is removed.

Then, as shown in FIG. 5F, the metal conducting portions 12 are formed in the openings 13.

Specifically, the conductive pattern 5 is formed over the insulating base layer 3, while the metal conducting portions 12 are formed in the openings 13. That is, the head-side terminals 7, the external-side terminals 17, and the signal wires 8 are formed in the pattern described above. At the same time, the metal conducting portions 12 are formed in the pattern described above so as to be continued to the signal wires 8.

To form the conductive pattern 5 and the metal conducting portions 12, a known patterning method such as, e.g., an additive method is used.

In the additive method, first, over the entire upper surfaces of the insulating base layer 3 and the exposed metal surfaces 16, a metal thin film (seed film) 5a is formed. As the metal thin film 5a, a metal material such as copper, chromium, nickel, or an alloy thereof is used. The thickness of the seed film is in a range of, e.g., 0.01 μm to 0.2 μm. The metal thin film 5a is formed by, e.g., a thin film formation method such as sputtering or plating. Preferably, the metal thin film 5a is formed by sputtering.

Next, on the top surface of the metal thin film 5a, a dry film resist is provided, exposed to light, and developed to form a plating resist not shown in a pattern reverse to the pattern of the conductive pattern 5 and the metal conducting portions 12. Then, by electrolytic plating, on the top surface of the metal thin film 5a exposed from the plating resist, the conductive pattern 5 and the metal conducting portions 12 are formed. Then, the plating resist and the portion of the metal thin film 5a where the plating resist is formed are removed by etching or the like.

Then, as shown in FIG. 5H, the insulating cover layer 6 is formed.

Specifically, the insulating cover layer 6 is formed on the insulating base layer 3 so as to cover the conductive pattern 5 and the metal conducting portions 12 and expose the head-side terminals 7 and the external-side terminals 17. For example, in the same manner as in the formation of the insulating base layer 3, a solution of a photosensitive curable insulating composition is applied onto the insulating base layer 3 including the conductive pattern 5 and the metal conducting portions 12 to form a photosensitive insulating cover coating. Then, the photosensitive insulating cover coating is exposed to light and developed into the pattern described above and then cured by heating as necessary.

Then, as necessary, a metal plating layer is formed on the upper surface of each of the head-side terminals 7 and the external-side terminals 17, though not shown in the drawings. The metal plating layer is made of, e.g., gold and/or nickel and has a thickness in a range of, e.g., 0.01 to 1 µm.

Then, as shown in FIG. 5I, the support openings 23 and the slits 21 (see FIG. 1) are formed in the metal supporting layer 2. By forming the support openings 23, the support connection portions 18 are formed.

The support openings 23 and the slits 21 are formed by, e.g., etching, drilling perforation, laser processing, or the like.

In this manner, the suspension board with circuit 1 is obtained.

Thereafter, the magnetic head (not shown) is connected to the head-side terminals 7, while the external substrate (not shown) is connected to the external-side terminals 17.

Between the magnetic head and the external substrate, an electric signal is transmitted to the head-side terminals 7, the signal wires 8, and the external-side terminals 17. At this time, the electric signal transmitted by one of the second wires 20 is transmitted to one of the first wires 19 via the signal wire connection portion 11 without involving a short circuit to the other second wire 20 at the cross connection portion 9.

Thus, the signal wires (the pair of write wires 8W and the pair of read wires 8k) are used as differential signal wires. Specifically, a first electric signal is transmitted to the first wires 19A and 19B of the pair of write wires 8W, and a second electric signal in anaphase to the first electric signal is transmitted to the second wires 20A and 20B of the pair of write wires 8W Specifically, the first electric signal is transmitted to the first wires 19A and 19B of the pair of read wires 8R, and the second electric signal in antiphase to the first electric signal is transmitted to the second wires 20A and 20B of the pair of read wires 8R.

The metal conducting portions 12 connect the differential signal wires for transmitting differential signals.

In accordance with the producing method of the suspension board with circuit 1, the curable insulating layer 3b is cured to form the insulating base layer 3. After the exposed metal surfaces 16 exposed from the openings 13 are subjected to the microwave plasma treatment, the metal conducting portions 12 are formed on the exposed metal surfaces 16.

This allows the foreign material 22 (component derived from the curable insulating layer) deposited on the exposed metal surfaces 16 in the openings 13 to be effectively removed. As a result, it is possible to reduce electric resistance values at the interfaces between the metal conducting portions 12 and the exposed metal surfaces 16.

In particular, in accordance with the producing method, the microwave plasma treatment is performed. This allows the treatment to be performed more accurately than by conventional wet etching using a cleaning solution. As the exposed metal surfaces 16 are smaller in size, the rate of increase in the electric resistance value at each of the interfaces between the metal conducting portions 12 and the exposed metal surfaces 16 is higher. Therefore, the producing method is particularly effective for the suspension board with circuit 1 having the smaller-size openings 13.

Also, in accordance with the producing method of the suspension board with circuit 1, the metal conducting portions 12 electrically connect the differential signal wires. Therefore, it is possible to reduce a differential impedance and thus reduce noise in electric signals.

Also, in accordance with the producing method of the suspension board with circuit 1, the plurality of (two) openings 13 and the plurality of (two) metal conducting portions 12 are formed in each of the signal wire connection portions 11. The plurality of (two) metal conducting portions 12 are electrically coupled to each other via the metal supporting layer 2. Therefore, it is possible to allow the pair of second wires 20 to cross each other without causing contact therebetween. This allows an improvement in the degree of freedom of the placement of the wires. In addition, since the number of insulating layers need not be increased, the suspension board with circuit 1 can be reduced in film thickness and cost.

(Modification)

In the embodiment in FIG. 1, as shown in FIGS. 4B to 4D, the photosensitive curable base coating 3a is formed and then subjected to exposure and development to form the curable insulating layer 3b formed with the openings 13. However, it is also possible to, e.g., screen-printing a solution of a photosensitive curable insulating composition and thus form the curable insulating layer 3b formed with the openings 13, though not shown in the drawings.

In this case, the curable insulating layer 3b formed with the openings 13 may also be a curable insulating layer having photosensitivity.

In terms of allowing the small-size openings 13 to be accurately formed, as shown in FIGS. 4B to 4D, the openings 13 are preferably formed by forming the photosensitive curable base coating 3a and subjecting the photosensitive curable base coating 3a to exposure and development.

Figure 2:
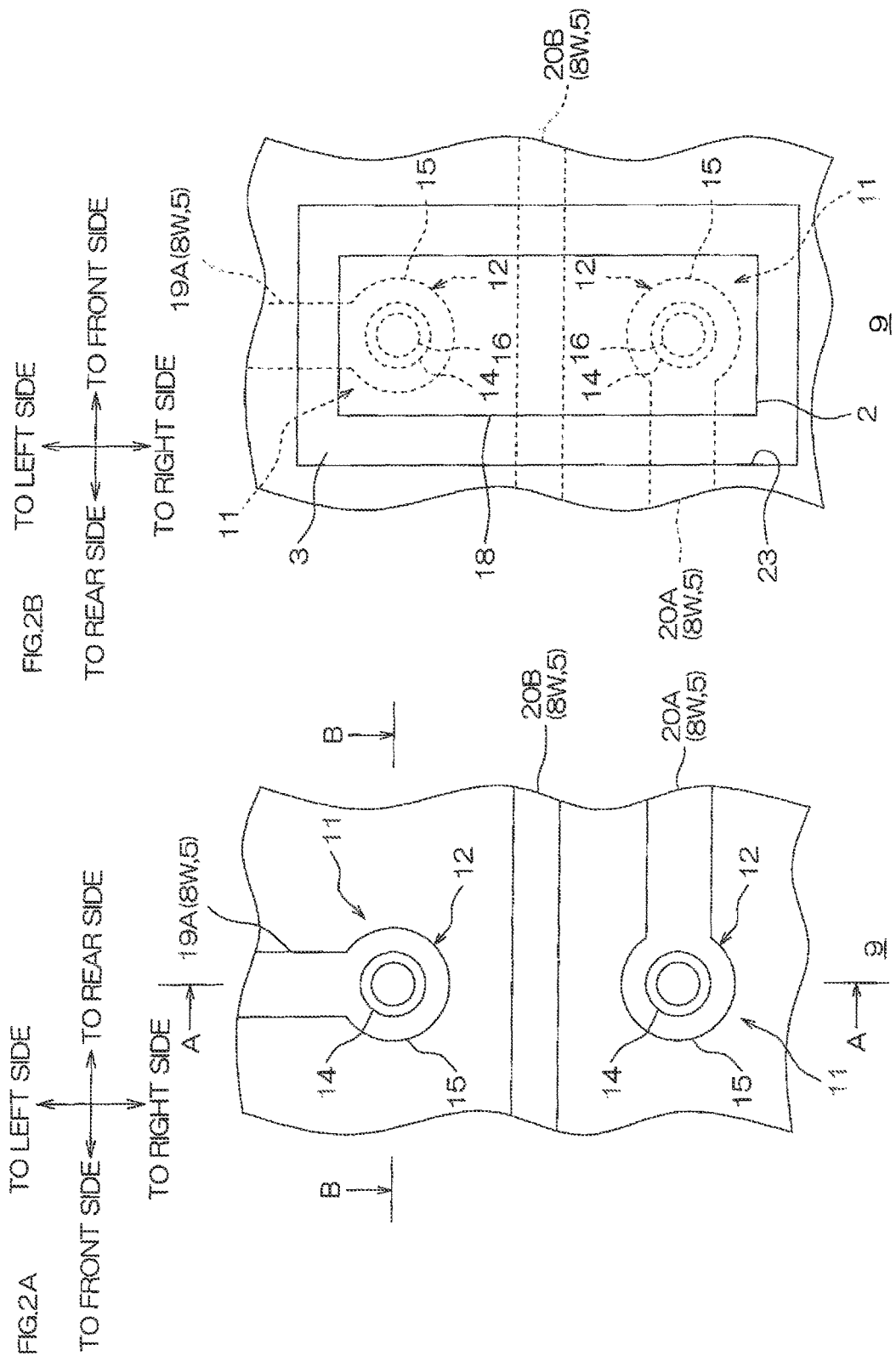
FIGS. 2A and 2B are enlarged views of each of the wire cross regions of the suspension board with circuit shown in FIG. 1, FIG. 2A showing a plan view, and FIG. 2B showing a bottom view.

In the embodiment in FIGS. 1 to 3, the signal wire connection portions 11 have been described as connection portions for the differential signal wires. However, it is also possible to, e.g., use the signal wire connection portions 11 as connection portions for ground wires, though not shown in the drawings.

In an embodiment in which the signal connection portions 11 are used as the connection portions for the ground wires, the metal supporting layer 2 formed with the exposed metal surfaces 16 are grounded (connected to the ground). Also, in the metal supporting layer 2, the support openings 23 are not formed.

EXAMPLES

While in the following, the present invention will be described more specifically by showing Examples and Comparative Examples, the present invention is not limited thereto. The numerical values shown below in Examples can be replaced with the numerical values upper-limit or lower-limit values) shown in the embodiment described above.

Example 1

A metal supporting layer made of stainless steel and having a thickness of 18 μm was prepared (see FIG. 4A). Then, a varnish of a photosensitive curable insulating composition made of a polyimide precursor was applied onto the metal supporting layer and dried at 160° C. for 5 minutes to form a photosensitive curable base coating (having a thickness of 10 μm) (see FIG. 4B).

Then, using a photomask, the portions of the photosensitive curable base coating corresponding to exposed metal surfaces were shielded, while the portion thereof to be formed with an insulating base layer was exposed to light at an exposure dose of 0.4 J/cm² (see FIG. 4C) and then developed (see FIG. 4D). Thus, a curable insulating layer including openings exposing the exposed metal surfaces was formed.

Then, the curable insulating layer was cured by heating at 360° C. for 3 hours to form an insulating base layer (having a thickness of 10 μm) (see FIG. 4E). Each of the openings of the insulating base layer had a generally circular shape in plan view. The outer diameter $W_1$ of the opening was 40 μm. The inner diameter $W_2$ (diameter of each of the exposed metal surfaces) of the opening was 30 μm.

Subsequently, the laminated body in FIG. 4E was placed in a microwave plasma generator (available under the trade name "M110-RTR" from Nissin Inc. and having a frequency of 2.45 GHz) such that the distance from a plasma emission hole to each of the exposed metal surfaces was 15 cm. Then, under the conditions shown in Table 1, microwave plasma treatment was performed on the exposed metal surfaces in the openings (see FIG. 5F).

Then, over the respective entire upper surfaces of the insulating base layer and the exposed metal surfaces, a Cu thin film (seed film having a thickness of 0.1 μm) was formed by sputtering. Then, on the top surface of the Cu thin film, a dry film resist was formed in a pattern reverse to the pattern of a conductive pattern and metal conducting portions. Then, by electrolytic copper plating, the conductive pattern and the metal conducting portions each having a thickness of 10 μm were formed on the top surface of the Cu thin film exposed from the resist (see FIG. 5G).

Each of the metal conducting portions was formed to have a circular shape in plan view such that the inner portion thereof filled the opening and the outer portion thereof was connected to a signal wire. The diameter $W_3$ of the metal conducting portion was 70 μm.

Then, a resist and the Cu thin film on which the resist was formed were removed by etching, and an insulating cover layer made of polyimide and having a thickness of 5 μm was formed on the insulating base layer so as to cover the conductive pattern and the metal conducting portions (see FIG. 5H).

Thereafter, support openings and slits were formed by etching, while the metal supporting layer was simultaneously trimmed (see FIG. 5I).

In this manner, a suspension board with circuit was obtained.

Examples 2 and 3

Suspension boards with circuits were obtained in the same manner as in Example except that the conditions for the microwave plasma treatment were changed to the conditions shown in Table 1.

Comparative Example 1

A suspension board with circuit was obtained in the same manner as in Example 1 except that no microwave plasma treatment was performed.

Comparative Example 2

A suspension board with circuit was obtained in the same manner as in Example 1 except that RF plasma treatment was performed using an RF plasma generator (available from Hirano Koh-on Co., Ltd. and having a frequency of 13.56 MHz) under the conditions shown in Table 1, instead of the microwave plasma treatment.

(Measurement of Electric Resistance Values)

To each of the metal conducting portions of the suspension boards with circuits (suspension boards with circuits after the insulating cover layers were formed thereon) in each of Examples and Comparative Examples, a digital multimeter (Model 2000 available from Keithley Instruments Inc.) was connected to measure electric resistance values at the metal conducting portions and the exposed metal surfaces. The result of the measurement is shown in Table 1.

TABLE 1

|  | Gas | Gas Pressure [Pa] | Gas Flow Rate [sccm] | Treatment Time [s] | Electric Power [kW] | Electric Resistance Value [Ω] |
|---|---|---|---|---|---|---|
| Example 1 | Nitrogen | 20 | 100 | 6 | 5 | 0.11 |
| Example 2 | Nitrogen | 100 | 3000 | 6 | 5 | 0.54 |
| Example 3 | Argon | 70 | 1000 | 6 | 4 | 0.27 |
| Comparative Example 1 | — | — | — | — | — | 0.81 |
| Comparative Example 2* | Nitrogen | 0.1 | 150 | 10 | 1.75 | 3.2 |

*Comparative Example 2 performed RF plasma treatment.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A method of producing a suspension board with circuit, comprising the steps of:

preparing a metal supporting layer;

forming a curable insulating layer on the metal supporting layer using a photosensitive curable insulating composition such that an opening is formed in the curable insulating layer;

curing the curable insulating layer to form an insulating layer;

subjecting the metal supporting layer exposed from the opening to microwave plasma treatment having a frequency in a range of 1.0 GHz to 10 GHz, thereby to remove foreign material which is a component derived from the curable insulating layer and is deposited on the metal supporting layer exposed from the opening; and forming a metal conducting portion on the metal supporting layer exposed from the opening.

2. The method of producing a suspension board with circuit according to claim 1, wherein the step of forming the curable insulating layer is performed by applying a solution containing the photosensitive curable insulating composition onto the metal supporting layer and developing the applied solution.

3. The method of producing a suspension board with circuit according to claim 1, wherein a gas used for the microwave plasma treatment contains an inert gas.

4. The method of producing a suspension board with circuit according to claim 1, wherein the metal conducting portion is electrically connected to differential signal wires.

5. The method of producing a suspension board with circuit according to claim 4, wherein a plurality of the openings and a plurality of the metal conducting portions are formed, and the plurality of metal conducting portions are electrically connected to each other via the metal supporting layer.

* * * * *